United States Patent
Urata et al.

(10) Patent No.: US 9,503,013 B2
(45) Date of Patent: Nov. 22, 2016

(54) MOTOR DRIVE VOLTAGE CONTROL DEVICE AND METHOD FOR CONTROLLING MOTOR DRIVE VOLTAGE

(71) Applicant: Schaft Inc., Koto-Ku Toyko (JP)

(72) Inventors: Junichi Urata, Tokyo (JP); Masayuki Inaba, Chiba (JP)

(73) Assignee: Schaft Inc., Tokyo (JP)

(*) Notice: Subject to any disclaimer, the term of this patent is extended or adjusted under 35 U.S.C. 154(b) by 0 days.

(21) Appl. No.: 14/648,289

(22) PCT Filed: Dec. 12, 2013

(86) PCT No.: PCT/JP2013/083313
§ 371 (c)(1),
(2) Date: May 29, 2015

(87) PCT Pub. No.: WO2014/097959
PCT Pub. Date: Jun. 26, 2014

(65) Prior Publication Data
US 2015/0311852 A1  Oct. 29, 2015

(30) Foreign Application Priority Data

Dec. 22, 2012  (JP) .................. 2012-280355

(51) Int. Cl.
H02P 6/10 (2006.01)
H02P 27/08 (2006.01)
H03M 3/00 (2006.01)

(52) U.S. Cl.
CPC ............. *H02P 27/08* (2013.01); *H03M 3/30* (2013.01)

(58) Field of Classification Search
CPC ............. H02P 27/04; H02P 6/10; H02P 6/14; G05B 11/28
(Continued)

(56) References Cited

U.S. PATENT DOCUMENTS 6,208,537 B1* 3/2001 Skibinski ............... H02M 1/12
                                                        363/40
2009/0080115 A1  3/2009 Kokami et al.
2010/0259206 A1 10/2010 Joachimsmeyer

FOREIGN PATENT DOCUMENTS

EP  1 696 551  8/2006
EP  1 914 878  4/2008
(Continued)

OTHER PUBLICATIONS

International Search Report prepared by the Japanese Patent Office in international application No. PCT/JP2013/083313 completed Feb. 27, 2014.
(Continued)

*Primary Examiner* — Antony M Paul
(74) *Attorney, Agent, or Firm* — McDonnell Boehnen Hulbert & Berghoff LLP (57) ABSTRACT

To suppress a decline in the control accuracy of an applied voltage associated with an increase in quantum noise, and to increase the control accuracy of a motor speed. When generating a driving voltage signal supplied to a motor from a driving command signal, a motor-driving voltage control device reduces the gradation level and performs noise-shaping modulation before performing PWM modulation. Reducing the gradation level allows the degree of gradation of the driving voltage signal to be within the resolution range of the PWM modulation, and thus PWM modulation can be performed even when the driving voltage signal has a high frequency. Noise-shaping modulation reduces the level of quantum noise near the low frequency range by causing the quantum noise due to digitization, included in the driving voltage signal, to be biased toward the high frequency range side. Of modulation signals with the reduced-gradation level, the components near the high frequency band are cut, while the components near the low frequency range are used (Continued)

to suppress quantum noise and control the driving voltage applied to the motor with a high accuracy.

9 Claims, 6 Drawing Sheets

(58) Field of Classification Search
USPC ......... 318/599, 606, 400.17, 400.23, 400.24, 318/400.25, 700, 701, 723, 727, 807, 810, 318/811, 812, 503, 400.01, 400.14, 400.15, 318/799, 800, 801, 430, 432; 363/21.1, 23, 363/25, 41, 45, 120
See application file for complete search history.

(56) References Cited

FOREIGN PATENT DOCUMENTS

| JP | H05 308791 | 11/1993 |
|---|---|---|
| JP | 5-344780 | 12/1993 |
| JP | 2001-037282 | 2/2001 |
| JP | 2003-124812 | 4/2003 |
| JP | 2009-044321 | 2/2009 |

OTHER PUBLICATIONS

International Preliminary Report on Patentability and Written Opinion prepared by the Japanese Patent Office in international application No. PCT/JP2013/083313 mailed Jul. 2, 2015.
Supplementary European Search Report prepared by the European Patent Office in Application No. EP 13 86 4838, mailed Aug. 10, 2016.
Homann, "Usage of Delta Sigma Converters in the Control of Electrical Drives", retrieved from the Internet: https://www.ifr.ing.tu-bs.de/en/dept-control-engineering/research/industrial-drive-control/usage-of-delta-sigma-converters-in-the-control-of-electrical-drives, retrieved on Jul. 28, 2016.

* cited by examiner

MOTOR DRIVE VOLTAGE CONTROL DEVICE AND METHOD FOR CONTROLLING MOTOR DRIVE VOLTAGE

FIELD OF THE DISCLOSURE

The present invention relates to the field of motor-driving and to reducing the quantization noise of the driving voltage provided for a motor.

BACKGROUND OF THE DISCLOSURE

It is known that the rotating speed of a motor is controlled by modulating the amplitude of the voltage applied to the motor by using PWM (Pulse Width Modulation). For PWM control, the amplitude of the control signal that controls motor-driving is modulated to the pulse width, and applying the driving voltage signal that is modulated using PWM to the motor allows the power provided to the motor to be controlled, thereby controlling the rotating speed.

Figure 4:
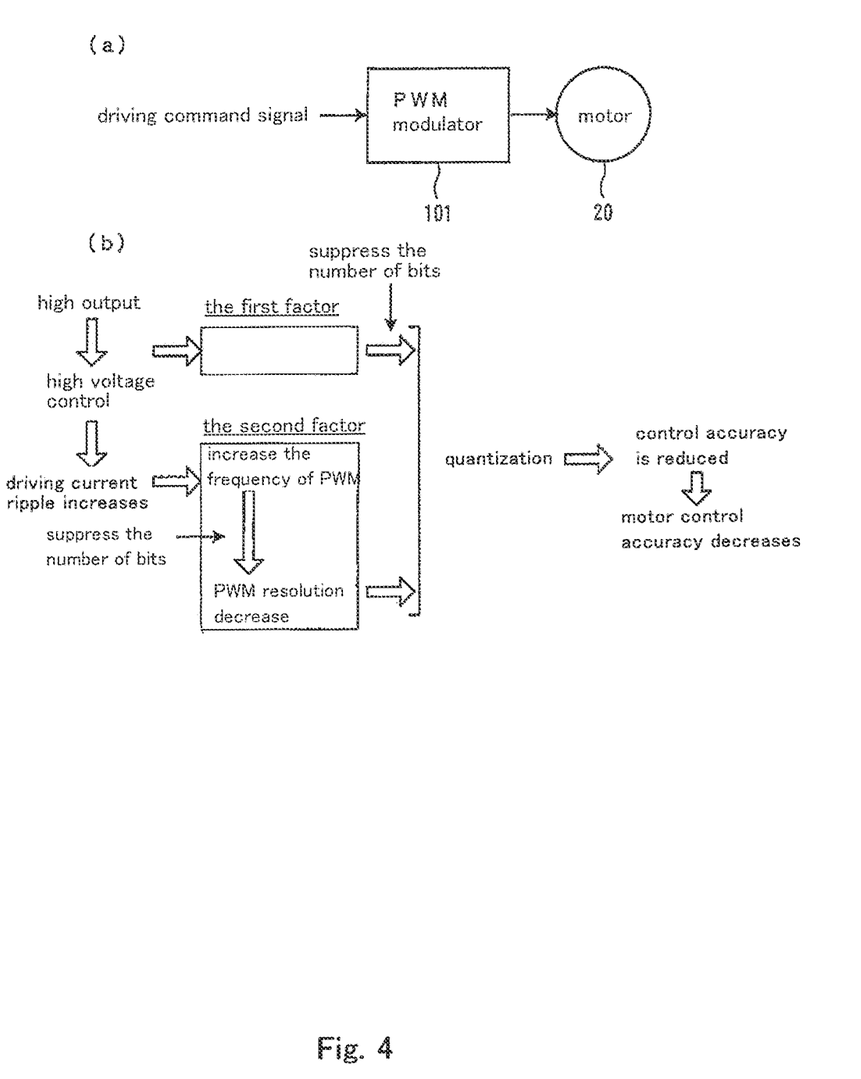
FIG. 4 is a schematic view of the motor control using the PWM control and a diagram that shows the quantization noise increase.

FIG. 4(a) is a schematic view of the motor control using PWM control. In the PWM control of the motor shown in FIG. 4(a), the amplitude of a driving command signal that controls the rotation in a PWM modulator 101 is modulated to the pulse width using PWM, and then the modulated signal by using pulse width modulation is applied to the motor 20.

It is known that the rotating speed varies as a result of ripple of the driving voltage in the motor control using PWM control.

Figure 6:
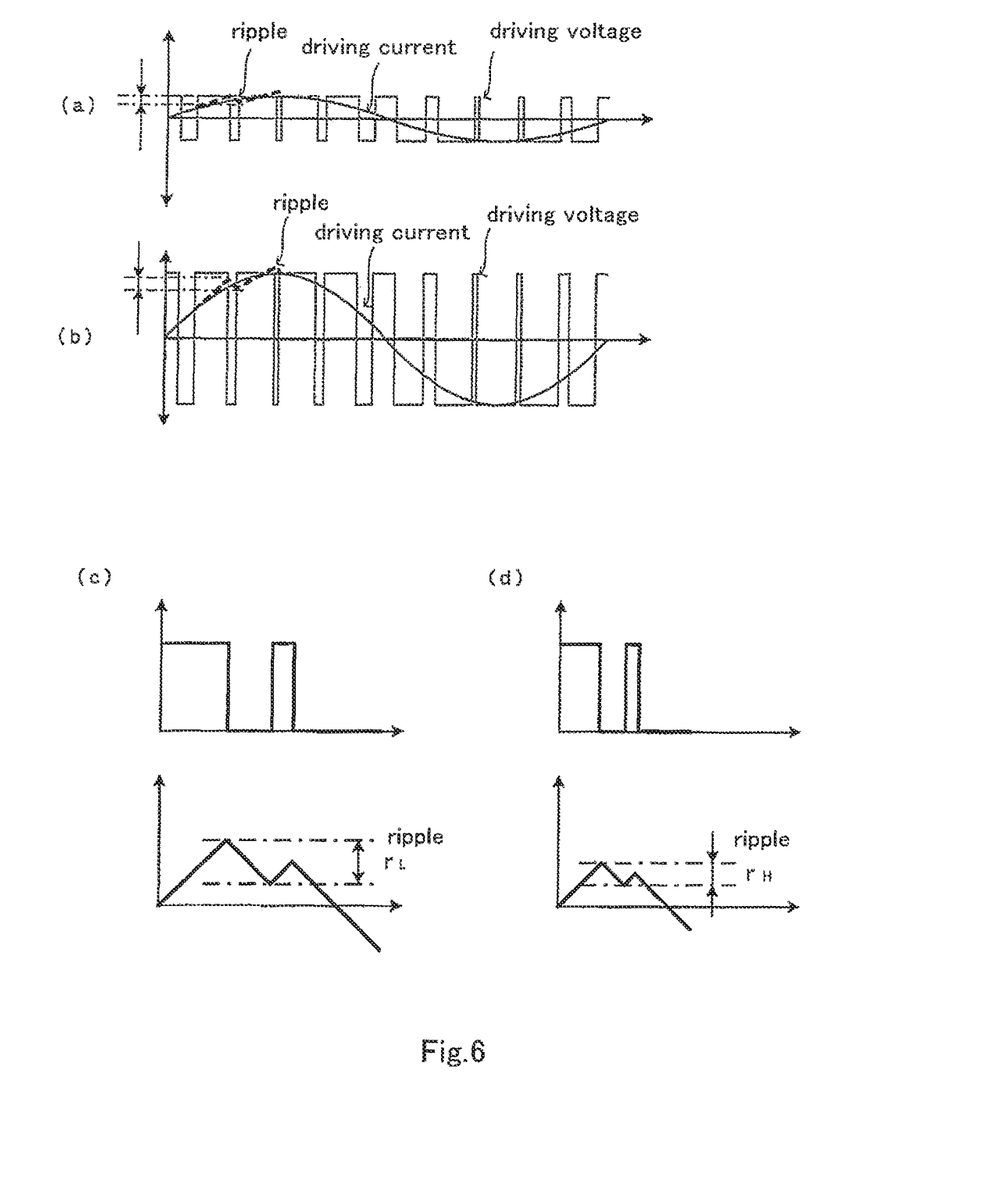
FIG. 6 is a diagram that shows ripple generated using PWM control.

When the driving voltage (PWM signal) obtained using PWM modulation is applied to the motor, a smoothed driving current flows in the motor. Then, the ripple of the driving current of the motor is generated as a result of the variation of the driving current while the driving current follows a change of the driving voltage that is a PWM signal. The ripple of the driving current increases with the conversion of the driving voltage. FIGS. 6(a) and (b) explain the ripple that is generated during PWM modulation. When the amplitude of the driving voltage is small, the ripple is small due to the small voltage variation. However, when the amplitude of the driving voltage is large, the ripple increases due to the large voltage variation. The broken lines in FIGS. 6(a) and (b) show one example of the ripple.

A technology that allows torque ripple to decrease in the motor control by using a Δ-Σ modulation has been known (Patent document 1).

Patent document 1 discloses a technique that reduces the torque ripple that appears in an offset due to a switching delay of comparators and/or MOSFETs constituting PWM circuits, by applying a negative feedback of the output signals of Δ-Σ modulation at the time of applying the voltage to the coil in the motor-driving by the PWM modulation.

RELATED ART

Patent document 1: JP5-344780 (paragraphs [0007] and [0010]).
Patent document 2: JP2003-124812

Problems to be Solved

In the PWM modulation of the driving command signal using digital processing, the amplitude resolution of the driving command signal depends on the clock period. It is limited to the width of one clock period. Since the width of one clock period is set to a minimum unit, the resolution is unable to be set to be smaller than the width of one clock period. Thus, there is a problem in that PWM modulated signals include the quantization noise that is generated when the signal amplitude is quantized using PWM modulation. The quantization noise is an amplitude error generated when the signal amplitude is quantized, and it has one half of the quantization step width.

There is a problem in that quantization noise reduces control accuracy in the motor speed control by the PWM control. The decrease of the motor control accuracy due to the quantization noise will be explained below in reference to FIG. 4(b).

There exist the two following factors, for example, that cause an increase in the quantization noise. Factor 1: The first factor is that the driving command signal has large variations in its range. If the resolution of PWM is fixed, the number of bits that are needed to represent the driving command signal is limited. Thus, the larger the range of the variation in the voltage of the driving command signal is, the larger the quantization noise is.

Factor 2: The second factor is that the PWM resolution is reduced in accordance with the increase in the frequency of PWM.

Even if pulse voltage is applied to the motor in PWM control, the current that is smoothed using the inductance of the motor coil flows through the motor, and thus a smooth operation can be obtained. However, when the range of the variation in the pulse voltage is so large that smoothing cannot follow the variation, thereby generating the torque ripple, the frequency of PWM control needs to be increased by the step of increasing the frequency, thereby supressing the range of the variation in the pulse voltage. The PWM resolution needs to be decreased in order to increase the frequency of PWM control, because electronic circuits have a limited speed of processing. Decreasing the resolution in PWM may cause the quantization noise to increase.

Since, in the PWM modulation, the length of the period of performing the modulation is expressed as a product of a clock period times the number of clocks within one period (resolution), if the clock period is constant, and the length of the period of the modulation is shortened by increasing the frequency, the number of pulses (resolution) within one period decreases. Since the resolution is associated with the gradation number and a low resolution causes it to be difficult to set a significant gradation number, increasing the frequency is a factor in increasing the quantization noise.

Figure 5:
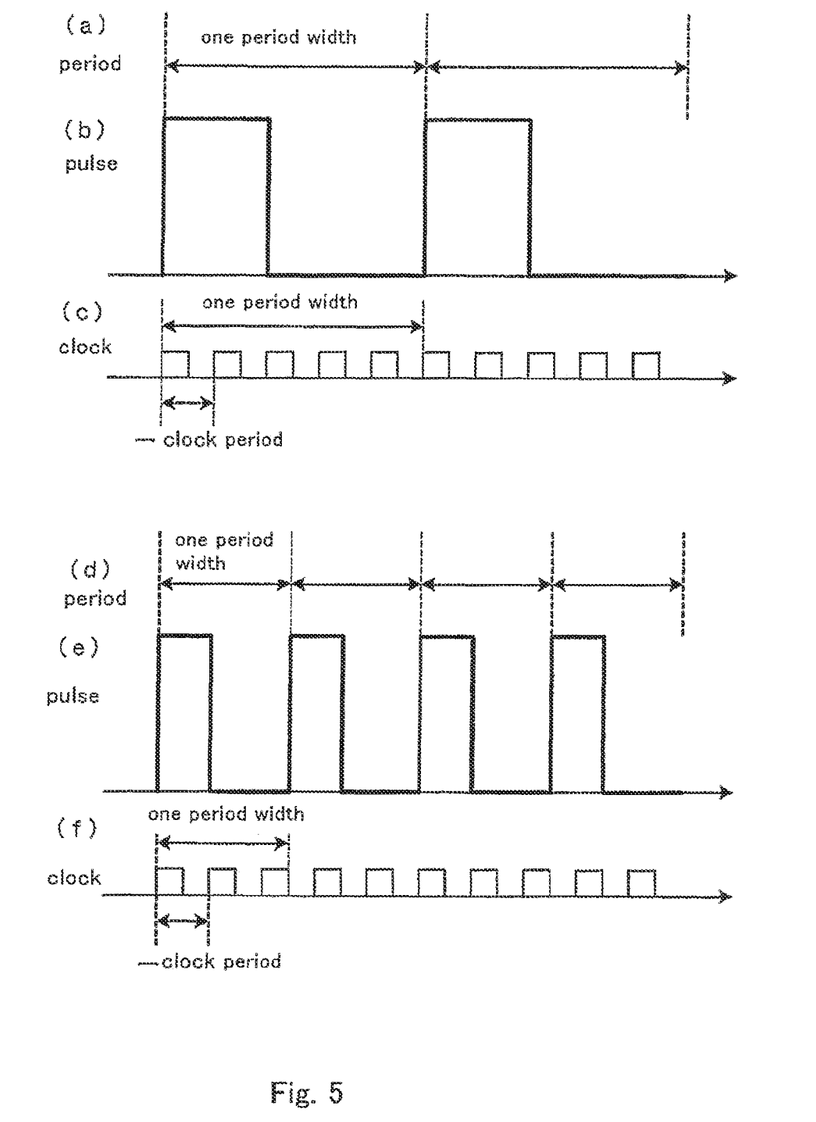
FIG. 5 is a diagram that shows the relation between the gradation number of the signal and the quantization step width and the relation between the gradation number of the signal and the quantization noise.

FIG. 5 shows the relationship between the length of the period and the resolution in the PWM modulation. FIGS. 5(a)-(c) show a case in which the modulation frequency of the PWM modulation is low. FIGS. 5(d)-(f) show a case in which the modulation frequency of the PWM modulation is high.

FIGS. 5(a) and (d) show the length of the period of performing the modulation in PWM modulation. FIGS. 5(b) and (e) show one pulse within the length of the period, and FIGS. 5 (c) and (f) show clocks within the length of the period.

Since the length of the period is shortened by causing the frequency to be higher (FIGS. 5(a) and (d)), the number of clocks within one period decreases if the clock period is constant (FIGS. 5(c) and (f)). Since the number of clocks within one period is associated with the resolution, the resolution decreases by causing the frequency to be higher.

Motors used in robots, industrial machines, and other areas that are required to have a high output are often required to convert the applied voltage to the motors into a high voltage to obtain a high motor output. This conversion into the high voltage further increases the quantization noise caused by in the two factors mentioned above.

In the first factor, the conversion of the driving command signal into a higher voltage increases the range of the voltage variation, thereby increasing the quantization noise.

In the second factor, the idea of increasing the modulation frequency of the PWM modulation comes to mind as a way to reduce the influence on the increase of the ripple involved with increasing the driving command voltage to a significantly high voltage.

FIGS. 6(c) and (d) illustrate reduction of the ripple by causing the modulation frequency to be higher. FIG. 6(c) shows a case where the modulation frequency of the PWM modulation is low, and FIG. 6(d) shows a case where the modulation frequency of the PWM modulation is high. Ripple $r_H$ (see FIG. 6(d)), where the modulation frequency is high, became smaller than ripple $r_L$ (FIG. 6(c)), where the modulation frequency is low, because the length of the period (one period width), where the modulation frequency is high, is shorter than that where the modulation frequency is low.

The reduction of the ripple by causing the modulation frequency to be higher will further heighten the quantization noise increase due to the second factor.

The quantization noise increase will reduce the control accuracy of the voltage applied to the motor, and further reduce the control accuracy of the motor speed.

Thus, the objects of the present invention include solving the problems of the conventional techniques explained above, suppressing the reduction of the control accuracy of the applied voltage due to the quantization noise increase, and increasing the control accuracy of the motor speed.

SUMMARY OF THE INVENTION

The present invention has a feature of lowering a gradation level and performing noise-shaping modulation before performing PWM modulation, when the driving voltage signal to be supplied to the motor is generated from the driving command signal. Lowering a gradation level allows the gradation level of the driving voltage signal to reach such a level that it falls within the resolution range of PWM modulation, thereby enabling PWM modulation even though the driving voltage signal has a high frequency.

The noise-shaping modulation allows the quantization noise caused by digitization that is included in the driving voltage signal to be biased toward the high-frequency range, thereby reducing the level of the quantization noise in the low-frequency range side. Within the frequency range of the modulated signal where the gradation level is lowered, the components of the high-frequency range are cut, and the components of the low-frequency range side are used, thereby suppressing the quantization noise. The driving voltage applied to the motor is controlled with a high degree of accuracy by suppressing the quantization noise. This suppressing effect on quantization noise can be more significant when the driving voltage signal is converted into a high voltage.

Since the quantization noise biased toward high-frequency range side by noise-shaping modulation can be cut off by the low-pass filter having the inductance of a coil (s), which the motor includes, the coil which the motor includes can be used as not only an element of the motor itself but also an element of the low-pass filter. The noise-shaping modulation can employ Δ-Σ modulation, for example. Also, it can employ another modulation system as well (for example, see patent document 2).

The present inventions include two aspects, such as a motor-driving voltage control device and a motor-driving voltage control method.

One aspect of the motor-driving voltage control device of the present invention includes a motor-driving voltage control device that generates a driving voltage signal to be provided for a motor based on a driving command signal, comprising the following: a low gradation unit that lowers the gradation level of the driving voltage signal and performs noise-shaping modulation in which quantization noise is biased toward a high-frequency range, and a PWM modulator that modulates the amplitude of the driving voltage signal to the pulse width thereof, the driving voltage signal having the low gradation level generated in the low gradation unit.

The low gradation unit causes the gradation level of the driving voltage signal to be lower to such a level that it falls within the resolution range of the PWM modulator, and causes the frequency components of the quantization noise to be unevenly distributed in the frequency side having higher frequencies than the cutoff frequency of the low-pass filter that includes inductance of the motor by the noise-shaping modulation.

The PWM modulator supplies to the motor a driving voltage signal, the low gradation unit causing the gradation level of the driving voltage signal to be lower and causing the frequency components of the quantization noise thereof to be unevenly distributed in the higher frequency side.

The quantization noise that is biased toward the high-frequency range side of the driving voltage signal is cut by the low-pass filter that includes the inductance of the motor, thereby reducing the quantization noise of the driving voltage signal to be supplied to the motor.

The motor-driving voltage control device of the present invention may be configured to comprise a high voltage converter that converts the voltage of the driving voltage signal generated in the PWM modulator into a high voltage signal. The driving voltage signal, the voltage of which is increased in the high voltage converter, is supplied to the motor, thereby allowing the output of the motor to increase.

The motor-driving voltage control device of the present invention is configured to comprise a high frequency converter that increases the frequency of the driving command signal in the preceding stage of the low gradation unit. The high frequency converter may increase the frequency of the driving command signal, thereby allowing smoothing by the low-pass filter.

The high frequency converter of the present invention is configured to oversample the driving command signal at a higher frequency than the cutoff frequency of the low-pass filter.

Generally, in the driving control of the PWM modulation, frequency components of the driving command signal having higher frequencies than the cutoff frequency of the low-pass filter are blocked in the low-pass filter. Thus, when the digitized driving command signal is set on the frequency, it is sufficient to set frequency components which have a lower frequency than the cutoff frequency of the low-pass filter, and which allows a necessary degree of accuracy to be obtained.

However, when the driving command signal is received at a lower frequency than the cutoff frequency of the low-pass filter, even though noise-shaping is performed with the driving command signal, the quantization noise cannot be unevenly distributed in the frequency side having the higher frequencies than the cutoff frequency. Thus, no effect on reducing the quantization noise takes place.

Thus, if the high-frequency components in the frequency domain of the driving command signal are set to have a lower frequency than the cutoff frequency of the low-pass filter, the frequency components having higher frequencies than the cutoff frequency of the low-pass filter are obtained by oversampling the driving command signal, namely by sampling, at a high-frequency, the frequency components of the driving command signal having the lower frequency than the cutoff frequency of the low-pass filter. Thereafter, the quantization noise of the obtained driving voltage signal is caused to be unevenly distributed in the higher frequency than the cutoff frequency of the low-pass filter by performing the noise-shaping modulation, thereby lowering the gradation level. Thereby, the noise that is biased toward the high-frequency domain is cut off by the low-pass filter.

However, when the driving command signal is sampled at a high frequency and the high-frequency components of the frequency domain of the driving command signal are set to be at a higher frequency than the cutoff frequency of the low-pass filter, oversampling need not be performed. Thus, the quantization noise is caused to be unevenly distributed in a frequency range having higher frequencies than the cutoff frequency of the low-pass filter, by directly performing noise-shaping modulation without oversampling the driving command signal, and the gradation level is lowered, thereby removing the noise that is unevenly distributed in the high-frequency range by the low-pass filter.

The low gradation unit of the present invention can use a $\Delta$-$\Sigma$ modulator as a configuration that causes the gradation level to be lower and performs the noise-shaping modulation. Other types of modulation systems in addition to the $\Delta$-$\Sigma$ modulation can be used for the noise-shaping modulation.

The $\Delta$-$\Sigma$ modulator can perform the noise-shaping modulation using a configuration where the frequency components of the quantization noise are biased toward the high-frequency side by using a configuration of applying feedback of an output obtained through an integrator to an input, and can lower the gradation level by a quantizer that quantizes a modulated signal.

One aspect of the motor-driving voltage control method of the present invention includes the motor-driving voltage control method for generating a driving voltage signal to be supplied to a motor based on a driving command signal, comprising the following: lowering the gradation level of the driving voltage signal and performing noise-shaping modulation in which quantization noise is biased toward a high-frequency range, and modulating the amplitude of the driving command signal to the pulse width thereof, the driving command signal having a low gradation level generated in lowering the gradation level and performing the noise-shaping modulation.

Lowering the gradation level and performing the noise-shaping modulation (a low gradation process) include the following: causing the gradation level of the driving voltage signal to be lower to such a level that it falls within the resolution range of the PWM modulator, and causing the frequency of the quantization noise to be unevenly distributed in the frequency side having higher frequencies than the cutoff frequency of a low-pass filter that includes the inductance of the motor using the noise-shaping modulation.

The modulating amplitude of the driving voltage signal to pulse width thereof (a PWM modulation process) includes supplying to the motor a driving voltage signal, the gradation level of the driving voltage signal being caused to be lower and the frequency components of the quantization noise being caused to be unevenly distributed in a higher frequency side by lowering the gradation level and performing the noise-shaping modulation. The driving voltage signal obtained by the PWM modulation process passes through the inductance of the motor. Then the quantization noise that is unevenly distributed to the high-frequency side of the driving voltage signal is cut off by the low-pass filter having the inductance, thereby reducing the quantization noise of the driving voltage signal supplied to the motor.

The motor-driving voltage control method of the present invention comprises converting a voltage of the driving voltage signal generated in the PWM modulation process into a high voltage signal (a high voltage conversion process).

The motor-driving voltage control method of the present invention comprises increasing the frequency of the driving command signal (a high-frequency converting process) in the preceding process of the low gradation process. The high-frequency process includes increasing the frequency of the driving command signal to a high-frequency where smoothing of the signal is made possible by the low-pass filter.

The high-frequency converting process of the present invention includes oversampling the driving command signal at a higher frequency than a cutoff frequency of the low-pass filter in the preceding process of the low gradation process.

When the high-frequency range of the frequency domain of the driving command signal is set to a lower frequency than the cutoff frequency of the low-pass filter, this process includes sampling the driving command signal having lower frequencies than the cutoff frequency of the low-pass filter at a high-frequency by oversampling. Thereby the frequency components having higher frequencies than the cutoff frequency of the low-pass filter are obtained.

When the driving command signal is received at a lower frequency than the cutoff frequency of the low-pass filter, the quantization noise cannot be unevenly distributed in a frequency side having higher frequencies than the cutoff frequency even if the noise-shaping of the driving command signal is performed. Thus, the effect on the reduction of the quantization noise disappears. This is a problem. However, this problem can be resolved by increasing the frequency of the driving command signal by using oversampling.

When the driving command signal is sampled at a high frequency and the high-frequency range of the frequency domain of the driving command signal is set to be a higher frequency than the cutoff frequency of the low-pass filter, there is no need to increase the frequency by using oversampling, etc.; thus the gradation level of the driving command signal is directly caused to be lower in the low gradation process without performing the high-frequency converting process.

The high-frequency converting process extends the frequency range where the quantization noise is distributed. Since the quantization noise is evenly distributed in the frequency range, lowering the gradation level of the driving command signal after increasing the frequency of the driving command signal using oversampling can cause the quantization noise level in the low-frequency domain to be lower than that of the driving command signal that is sampled at a normal sampling rate.

By the motor-driving voltage control device and the control method of the present invention, when the motor-driving voltage is controlled to generate the driving voltage signal that is supplied to the motor based on the driving command signal, a gradation signal of the driving voltage signal, the frequency of which is caused to be high, may be generated by sampling the driving command signal at a high-frequency. The gradation of the PWM signal needs to be decreased and the frequency needs to be made high to decrease the ripple width and reduce the quantization noise. Then, the frequency of the driving voltage signal can be caused to be as high as the frequency of the PWM modulation to be used even if the frequency of the original driving voltage signal is lower than the frequency of the PWM, by generating the driving voltage signal where the gradation level is set by using a high frequency.

When the gradation level of the driving command signal obtained from the controller, etc., is set by using a high frequency from the very beginning, it is not necessary to cause the frequency of the driving command signal to be high by using sampling, etc.

The gradation level of the gradation signal of the driving command signal is caused to be lower before modulating using PWM. In the modulated signal, the gradation level of which is lowered, the quantization noise is unevenly distributed in the high-frequency side by the noise-shaping modulation in the step of lowering the gradation level; thus the quantization noise level in the low-frequency side is reduced. Furthermore, when the gradation level is lowered, the gradation level of the modulated signal is reduced, and the driving voltage signal having a lower gradation level than that of the driving command signal is generated. Lowering the gradation level allows the PWM modulation circuit to cope, from the standpoint of the processing ability, with the PWM modulation of the driving command signal, the frequency of which increases.

After the PWM modulation of the driving command signal, the gradation level of which is lowered, and the generation of the driving voltage signal, the signal passes through the low-pass filter, thereby eliminating the quantization noise biased toward the high-frequency side by using the noise-shaping of lowering a gradation level, and the quantization noise of the driving voltage signal to be supplied to the motor is distributed only for the low-frequency side. Since the quantization noise in the low-frequency side is reduced by the noise-shaping in the step of lowering the gradation level, the quantization noise applied in the motor is reduced. The inductance of the motor can be utilized as a component of the low-pass filter.

By the aspect of the present invention, when the frequency of the PWM modulated signal is caused to be increased to suppress ripple, the quantization noise increase that is accompanied by the increase of the frequency can be suppressed, thereby allowing the voltage applied to the motor to be controlled with a high degree of accuracy.

Effect of the Invention

As explained above, the motor-driving voltage control device and the motor-driving voltage control method of the present invention can suppress the decrease of the control accuracy of the applied voltage accompanied by quantization noise increase, and can increase the control accuracy of the motor speed when converting the voltage of the signal used in the motor control into a high voltage.

DETAILED DESCRIPTION OF THE INVENTION

The embodiments of the present invention will be explained in detail below with reference to figures. Configuration examples of the motor-driving voltage control device of the present invention will be explained below with reference to FIGS. 1, 2, and 3.

Figure 1:
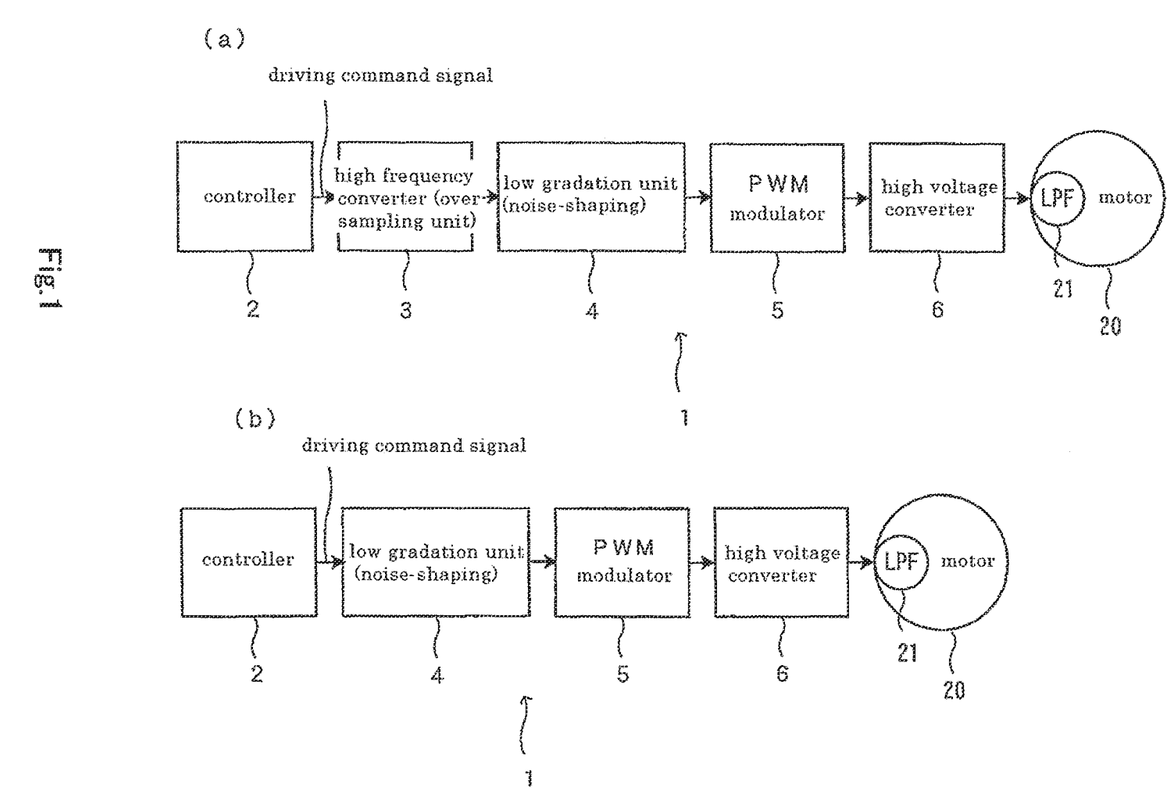
FIG. 1 is a block diagram of the motor-driving voltage control system of the present invention.
Figure 2:
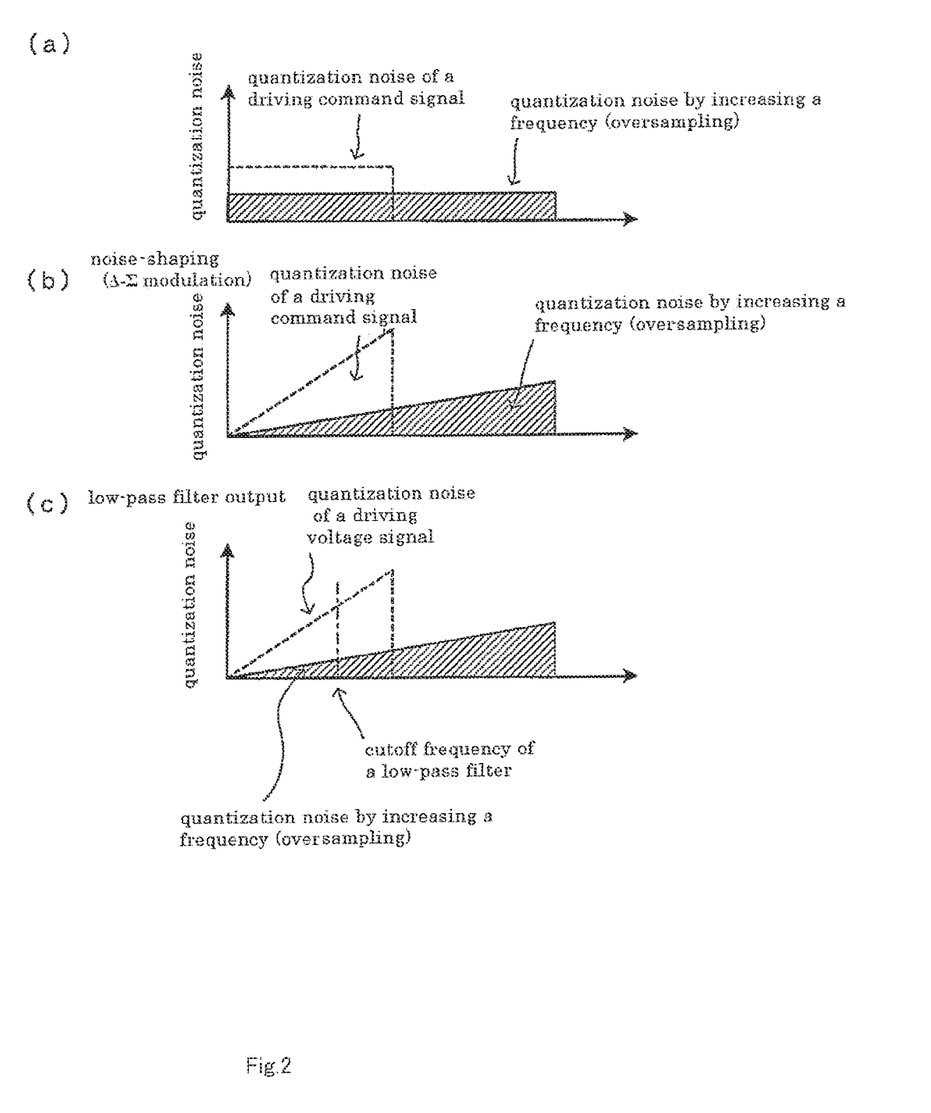
FIG. 2 is a diagram that shows the quantization noise of each section of the motor-driving voltage control system.
Figure 3:
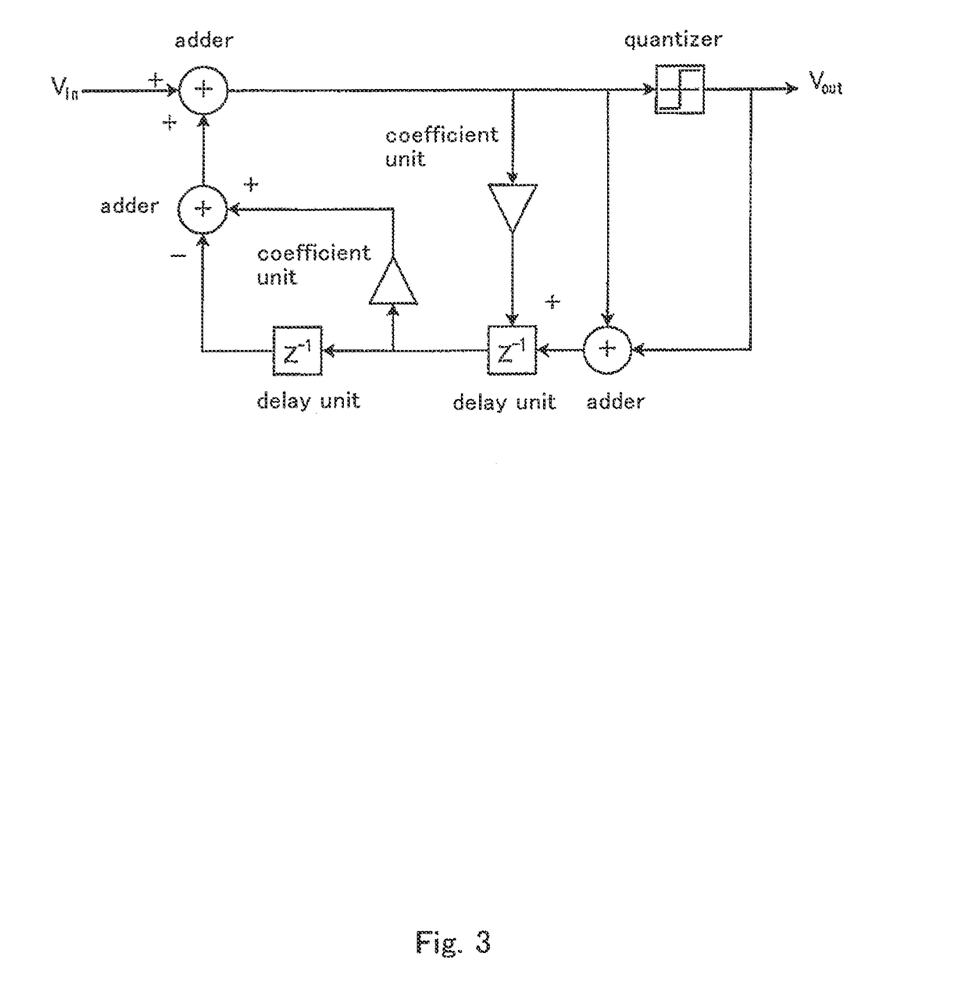
FIG. 3 is a diagram that shows an exemplary circuit configuration of Δ-Σ modulation of the motor-driving voltage control.

FIGS. 1, 2, and 3 illustrate configuration examples of the motor-driving voltage control system of the present invention. FIG. 1 illustrates a schematic view. FIG. 2 illustrates the quantization noise of each section. FIG. 3 illustrates an example of a Δ-Σ modulation circuit.

Configuration Examples of the Present Invention

The configuration examples of the motor-driving voltage control system of the present invention will now be described. FIG. 1(a) illustrates a configuration example where the driving command signal input from a controller, etc., has a frequency lower than or equal to the cutoff frequency of the low-pass filter of the motor side. FIG. 1(b) illustrates a configuration example where the driving command signal input from the controller, etc. has a frequency higher than the cutoff frequency of the low-pass filter of the motor side.

As shown in FIG. 1(a), a motor-driving voltage controller 1 includes a high frequency converter 3 that increases the frequency of the driving command signal received from the controller, a low gradation unit 4 that causes the gradation level of the driving command signal having the high-frequency to be lower and performs noise-shaping, and a PWM modulator 5 that modulates the amplitude of the output of the low gradation unit 4 to pulse width to generate the driving voltage signal. Applying the driving voltage signal generated in the PWM modulator 5 to the motor 20 leads to performing the driving control based on the driving command signal.

A high voltage converter 6 may be connected to the PWM modulator 5. The output of the motor can be caused to be high by applying the driving voltage signal to the motor 20. the driving voltage signal having been converted into a high voltage signal in the high voltage converter 6.

The motor-driving voltage control device 1 in FIG. 1(b) does not include the high frequency converter 3 that is disposed between the controller 2 and the low gradation unit 4 in FIG. 1(a). Everything that does not include the frequency converter 3 is the same as the configuration in FIG. 1(a). The high frequency converter 3 is configured to include a circuit that performs oversampling, i.e., samples the signal at a higher frequency than the cutoff frequency of the low-pass filter.

Since the inductance of the motor acts as a low-pass filter, the frequency components of the driving voltage signal having higher frequencies than the cutoff frequency of the low-pass filter are cut off. So they do not work as the motor-driving. Thus, the driving command signal input from the controller or the like is sufficient, as long as it has the frequency characteristics that allow the motor to be controlled with the required degree of accuracy at a lower frequency range than the cutoff frequency of the low-pass filter.

However, when the driving command signal is sent at a lower frequency than the cutoff frequency of the low-pass filter, the quantization noise cannot be unevenly distributed in a higher frequency side than the cutoff frequency even if the noise-shaping of the driving command signal is performed. So there is no effect on reducing the quantization noise.

Thus, when the frequency of the driving command signal is set to be lower than the cutoff frequency of the low-pass filter, the frequency of the driving command signal is caused to be higher than the cutoff frequency of the low-pass filter by oversampling it at a high-frequency. After that, the quantization noise is biased toward the high-frequency range by using the noise-shaping modulation and the gradation level is lowered.

FIG. 1(a) shows a configuration that is applied when the high-frequency range of the frequency domain of the driving command signal is set to be lower than the cutoff frequency of the low-pass filter. The high frequency converter 3 increases the frequency of the driving command signal to a higher frequency than the cutoff frequency of the low-pass filter.

However, when the driving command signal has a higher frequency than the cutoff frequency of the low-pass filter that is formed using the inductance of the motor, it is not necessary to increase a frequency using oversampling. Thus, the high frequency converter 3 can be omitted. FIG. 1(b) shows a configuration that is applied when the frequency of the driving command signal is set to be higher than the cutoff frequency of the low-pass filter.

The high frequency converter 3 samples the driving command signal at a high-frequency in the preceding stage of the low gradation unit 4, and lowers the gradation level at the high-frequency to generate the driving command signal, the frequency of which is caused to be high. The driving command signal is input from the controller 2. The driving command signal may drive a motor that drives a driving mechanism for industrial machines and arms and legs for a robot, but is not limited to these applications.

Increasing the frequency of the driving command signal can be done by shortening the clock interval between one timing and next timing for quantizing the signal amplitude. Shortening the period width of pulses of the PWM signal reduces the ripple of the driving current while driving the motor. A frequency close to the PWM frequency can be used as a target frequency for increasing the frequency.

The high frequency converter 3 can be realized by using an oversampling circuit, for example. When the high-frequency components are set to a lower frequency than the cutoff frequency of the low-pass filter of the motor 20 in the frequency range of the driving command signal from the controller 2, the high frequency converter 3 oversamples the driving command signal at a high-frequency, and a signal having higher frequencies than the cutoff frequency of the low-pass filter is obtained.

When the driving command signal is sent from the controller at a lower frequency than the cutoff frequency of the low-pass filter, even if the noise-shaping of the driving command signal is performed, the quantization noise cannot be caused to be unevenly distributed in the frequency side having higher frequencies than the cutoff frequency. So the problem where there is no quantization noise-reduction effect arises. To resolve this problem, the frequency of the driving command signal is caused to increase to a high-frequency in the high frequency converter 3. So a higher frequency is obtained than the cutoff frequency of the low-pass filter. Thereby the noise can be unevenly distributed in the frequency domain having higher frequencies than the cutoff frequency of the low-pass filter in noise-shaping. Thus the noise unevenly distributed in the high-frequency domain can be cut off in the low-pass filter of the motor.

In addition, when the driving command signal from the controller is sampled at a higher frequency than the cutoff frequency of the low-pass filter, it is not necessary to increase the frequency by using oversampling in the high frequency converter 3, etc. In a case like this, it is not necessary to increase the frequency, and the gradation level of the driving command signal is lowered by using the noise-shaping modulation in the low gradation unit 4 without increasing the frequency.

Thus, the high frequency converter 3 can be selectively arranged based on the frequency of the driving command signal received from the controller 2. Namely, when the frequency of the driving command signal is set to be lower than the cutoff frequency of the low-pass filter, the high frequency converter 3 is arranged in the preceding stage of the low gradation unit 4. When the frequency of the driving command signal is set to be higher than the cutoff frequency of the low-pass filter, the low gradation unit 4 need not be arranged.

Also, when the high frequency converter 3 increases the frequency, the quantization noise can be reduced most efficiently by oversampling at the carrier frequency of PWM.

The low gradation unit 4 lowers the gradation level of the driving command signal, the frequency of which is caused to increase in the high frequency converter 3. The low gradation unit 4 causes the gradation level of the driving voltage signal to be lower to such a level that it falls within the resolution range of the PWM modulator 5, and causes the frequency components of the quantization noise to be unevenly distributed in a higher frequency side than a cutoff frequency of a low-pass filter, which includes the inductance of the motor by the noise-shaping modulation. For example, the low gradation unit 4 can perform the above operation using a Δ-Σ modulation. The quantization noise generated due to the digital processing of the high frequency converter 3, etc., is distributed uniformly within a frequency range of one half of the sampling frequency.

The noise-shaping modulation in the low gradation unit 4 causes the quantization noise to be biased toward the high-frequency range side, and reduces the quantization noise level of the low-frequency range side. Since the generated quantization noise energy is constant, an absolute amount of the quantization noise level in the low-frequency range side is reduced by using a distribution profile where the quantization noise is biased toward the high-frequency range and the quantization noise level in the low-frequency range side is reduced.

The gradation number of a modulated signal of the low gradation unit 4 is decreased by lowering the gradation level. So the driving voltage signal with a lower gradation level than the driving command signal transmitted from the controller 2 is generated.

The driving command signal, the gradation level of which is lowered in the low gradation unit 4, and where the noise-shaping modulation is performed, is modulated using the PWM in PWM modulator 5. It may be converted into the high voltage signal in the high voltage converter 6. After that the signal may be applied to the motor 20. Alternatively it may be directly applied to the motor 20 without passing through the high voltage converter 6.

The PWM modulator 5 supplies to the motor 20 the driving voltage signal. The gradation level of the driving voltage signal is lowered in the low gradation unit 4 and the quantization noise is biased toward the high-frequency side.

The inductance of coils that are included in the motor 20 makes up the low-pass filter 21, and it cuts off the high-frequency components of the driving voltage signal that is applied, leaving only low-frequency components as the quantization noise.

The high voltage converter 6 converts the voltage of the driving voltage signal output from the PWM modulator 5 into a high voltage signal. Increasing the voltage of the driving voltage signal expands the range in which the driving voltage signal can be set and allows the motor-driving to be controlled with a high degree of accuracy.

Next, the quantization noise of each part is explained. FIG. 2(*a*) shows the quantization noise of the driving command signal and the quantization noise of the driving command signal after the frequency is increased. FIG. 2(*b*) shows the quantization noise of the driving command signal after the noise-shaping modulation. FIG. 2(*c*) shows the quantization noise of the driving command signal after the signal passes through the low-pass filter.

In FIG. 2(*a*), the quantization noise of the driving command signal (shown by a broken line in the Figure) is expanded into the high-frequency range and the level decreases by increasing the frequency using oversampling, etc., as shown in the portion of a solid line and oblique lines in the Figure. Furthermore, in the stage of increasing the frequency of the driving command signal, the frequency level of the quantization noise is uniform in terms of frequency.

Performing the noise-shaping modulation in FIG. 2(*b*) allows the frequency components of the quantization noise to be biased toward the high-frequency range side. The broken line in the Figure indicates the quantization noise of the driving command signal which is biased. The area where a solid line and oblique lines are drawn in the Figure indicates the quantization noise of the driving command signal, the frequency of which is increased. The noise-shaping modulation allows the level of the quantization noise in the high-frequency range side to be high and allows the level of the quantization noise in the low-frequency range side to be low. The distribution of the quantization noise shown in FIG. 2(*b*) varies linearly. However, this distribution is just one example, and the distribution profile where the frequency components of the quantization noise are biased toward the high-frequency side varies depending on the characteristics of the circuit performing $\Delta$-$\Sigma$ modulation.

FIG. 2(*c*) shows the quantization noise of the driving voltage signal which has passed through the low-pass filter. The quantization noise in the higher frequency range than the cutoff frequency of the low-pass filter is cut off, and only the quantization noise in a frequency range having lower frequencies than the cutoff frequency passes through the low-pass filter.

The broken line in the Figure shows the quantization noise that is biased, of the driving command signal. The area where a solid line and oblique lines in the Figure are drawn shows the quantization noise of the driving command signal, the frequency of which is increased.

The quantization noise transmitted to the motor is further reduced by increasing the frequency of the driving command signal and performing the noise-shaping modulation, compared with a case where the frequency of the driving command signal is not increased or the noise-shaping modulation is not performed.

FIG. 3 shows an example of a circuit where the low gradation unit is configured employing $\Delta$-$\Sigma$ modulation. The circuit employing $\Delta$-$\Sigma$ modulation in FIG. 3 is a configuration example of a second-order error feedback type. The configuration example in FIG. 3 can be configured by adders, delay units, coefficient units, and a quantizer. The output of the quantizer which is quantized by the quantizer and whose gradation level is lowered is fed back to the input side.

The present invention is not intended to be limited to the above embodiments. It is possible to modify the above embodiments in various ways based on the spirit of the present invention, and these modifications are not excluded from the scope of the invention.

INDUSTRIAL APPLICABILITY

The motor-driving control device and the method for controlling the motor drive according to the present disclosure can be applied not only to the motors provided for driving mechanisms of robots, but also to the motors provided for driving mechanisms of industrial machinery.

DESCRIPTION OF THE REFERENCE NUMERALS

1 motor-driving voltage control device
2 controller
3 high frequency converter (over-sampling unit)
4 low gradation unit
5 modulator
6 high voltage converter
20 motor
21 low-pass filter
101 modulator

What we claim is:

1. A motor-driving voltage control device that generates a driving voltage signal to be provided to a motor based on a driving command signal, comprising:

a low gradation unit that lowers a gradation level of the driving voltage signal and performs noise-shaping modulation in which quantization noise is biased toward a high-frequency range, and a PWM modulator that modulates amplitude of the driving voltage signal to pulse width thereof, the driving voltage signal having a low gradation level generated in the low gradation unit, wherein the low gradation unit:

causes the gradation level of the driving voltage signal to be lower to such a level that falls within a resolution range of the PWM modulator, and causes frequency components of quantization noise to be unevenly distributed in a frequency side having higher frequencies than a cutoff frequency of a low-pass filter that includes inductance of the motor by noise-shaping modulation, wherein the PWM modulator supplies to the motor a driving voltage signal, the low gradation unit causing the gradation level of the driving voltage signal to be lower and causing the frequency components of quantization noise thereof to be unevenly distributed in a higher frequency side.

2. The motor-driving voltage control device according to claim 1, further comprising a high voltage converter that converts a voltage of the driving voltage signal generated in the PWM modulator into a high voltage signal.

3. The motor-driving voltage control device according to claim 1, further comprising a high frequency converter that increases a frequency of the driving command signal in a preceding stage of the low gradation unit,
wherein the high frequency converter increases a frequency of the driving command signal to a high-frequency that allows smoothing by the low-pass filter.

4. The motor-driving voltage control device according to claim 3, wherein the high frequency converter oversamples the driving command signal at a frequency higher than a cutoff frequency of the low-pass filter.

5. The motor-driving voltage control device according to claim 1, wherein the low gradation unit comprises a Δ-Σ modulator.

6. A motor-driving voltage control method for generating a driving voltage signal to be provided for a motor based on a driving command signal, comprising:
lowering a gradation level of the driving voltage signal and performing noise-shaping modulation in which quantization noise is biased toward a high-frequency range, and
modulating an amplitude of the driving voltage signal to pulse width thereof, the driving voltage signal having a low gradation level generated during the lowering of the gradation level and performing the noise-shaping modulation,
wherein the lowering the gradation level and performing the noise-shaping modulation includes:
causing the gradation level of the driving voltage signal to be lower to such a level that falls within a resolution range of a PWM modulator, and
causing a frequency of quantization noise to be unevenly distributed in a frequency side having higher frequencies than a cutoff frequency of a low-pass filter that includes inductance of the motor by the noise-shaping modulation,
wherein modulating the amplitude of the driving voltage signal to pulse width thereof includes supplying to the motor a driving voltage signal, the gradation level of the driving voltage signal being caused to be lower and the frequency components of quantization noise being caused to be unevenly distributed in a higher frequency side by the lowering the gradation level and performing the noise-shaping modulation.

7. The method for generating a driving voltage signal according to claim 6, further comprising converting a voltage of the driving voltage signal generated in the modulating amplitude of the driving voltage signal into a high voltage signal.

8. The method for generating a driving voltage signal according to claim 6, further comprising increasing a frequency of the driving command signal in a preceding step of the lowering the gradation level and performing the noise-shaping modulation, and
the increasing the frequency of the driving command signal including increasing a frequency of the driving command signal to a high-frequency that allows smoothing by the low-pass filter.

9. The method for generating a driving voltage signal according to claim 8, wherein the increasing the frequency of the driving command signal includes oversampling the driving command signal at a higher frequency than a cutoff frequency of the low-pass filter.

* * * * *